United States Patent
Sylvester et al.

(10) Patent No.: US 6,919,619 B2
(45) Date of Patent: Jul. 19, 2005

(54) ACTIVELY-SHIELDED SIGNAL WIRES

(75) Inventors: Dennis M. Sylvester, Ann Arbor, MI (US); Himanshu Kaul, Ann Arbor, MI (US); David T. Blaauw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 10/377,318

(22) Filed: Feb. 28, 2003

(65) Prior Publication Data

US 2004/0169260 A1 Sep. 2, 2004

(51) Int. Cl.⁷ .............................................. H01L 39/00
(52) U.S. Cl. ........................ 257/662; 257/659; 438/453
(58) Field of Search .................................. 257/662, 659, 257/664, 208; 438/453

(56) References Cited

U.S. PATENT DOCUMENTS

| | | | | |
|---|---|---|---|---|
| 4,514,749 A | * | 4/1985 | Shoji ........................... | 257/664 |
| 5,550,518 A | * | 8/1996 | Mohwinkel ................... | 333/33 |
| 6,344,667 B1 | * | 2/2002 | Miyagi ......................... | 257/207 |
| 6,708,314 B2 | * | 3/2004 | Trivedi et al. ................ | 716/2 |

\* cited by examiner

*Primary Examiner*—Phat X. Cao
(74) *Attorney, Agent, or Firm*—Rader, Fishman & Grauer PLLC

(57) ABSTRACT

A system and method is provided that improves the propagation characteristics of an electrical conducting signal wire on an integrated circuit. The system includes a pair of parallel shielding wires positioned on opposite longitudinal sides of the signal wire. A shielding signal is applied to the shielding wires. The shielding signal is out of phase with the signal of interest propagated on the signal wire.

30 Claims, 4 Drawing Sheets

ACTIVELY-SHIELDED SIGNAL WIRES

This invention was made with government support under sub-contract SA3274JP of rant MDA972-99-1-0001 from Prime Contractor DARPA. The government has certain rights in the invention.

BACKGROUND

The present invention relates generally to the propagation of electrical signals over electrical conducting wires, and, more particularly to the propagation of electrical signals on wires on integrated circuits.

The wires that propagate signals between logic stages on an integrated circuit can be implemented in different widths. The chosen width for such wires in a given integrated chip has significant affects on the propagation characteristics of the signal being carried over the wires. For example, relatively wide wires physically consume more space and have relatively lower levels of resistance. The lower resistance level results in relatively faster signal transition times on the wire, thereby generating faster signal propagation through the integrated circuit. But the lower resistance also amplifies the inductive characteristics of the wire, which generally causes the peaks of the propagating signal to be undershot or overshot, thereby causing "ringing" on the line and thus reducing the signal integrity and reliability. On the other hand, relatively narrow wires consume less space on the integrated circuit and have relatively higher levels of resistance. The higher resistance level on the wires decreases the inductive characteristics of the wire, but amplifies the capacitive characteristics of the wire. As a result, the quality (transition slope) and propagation speed of the signal over the wire is degraded. Designers of integrated circuits must consider these types of effects associated with the width of the wires when designing integrated circuit applications. Oftentimes, designers of integrated circuits balance the positive and negative effects of different wire sizes to arrive at an optimal wire size for a given application.

Certain integrated circuit applications, such as clock nets, require very fast signal transition times on the wires. To achieve the required signal transition times, such applications commonly use relatively wide wires to propagate signals between logic stages. As described above, the use of relatively wide wires results in ringing on the wire caused by the increased inductive characteristics caused by the relatively lower resistance. To reduce the undesirable affects associated with the increased inductive characteristics of the relatively wide wires, it is typical to incorporate "shields" for the wires on the integrated circuits. The "shields" comprise electrical conducting strips or wires positioned parallel to and on both sides of the signaling wire. FIG. 1 illustrates an exemplary signaling wire 12 having two shields 14a and 14b on either side of the signaling wire 12 on an integrated circuit. Both shield wires 14a and 14b are connected to a ground grid. This application of shielding a signaling wire with grounded shielding wires is referred to herein as "passive shielding." Still referring to FIG. 1, an input signal (sometimes referred to herein as the "signal of interest") is boosted by an inverter gate 16 (as is common) before being applied to the signaling wire 12. At the end of the signaling wire 12, the signal is inverted again (by inverter 18) to return the signal to its original polarity as an output signal. As the input signal propagates down the signaling wire 12, the shield wires 14a and 14b reduce the inductive effects of the signaling wire 12 and the associated overshoot/undershoot and ringing effects.

While passive shielding of signaling wires on an integrated chip improves the signal propagation characteristics of the signaling wires, it does not improve the characteristics enough for certain very wide wires, such as clock nets on integrated circuits. For very wide wire applications, it is common to split the signaling wire up into multiple "fingers", wherein the collective widths of the "fingers" equals the width of the original signaling wire (had it not been split up). The signal propagates down the "fingers" and is combined at the end of the wire. FIG. 2 illustrates a signaling wire split into two fingers 12a and 12b, each of which being connected to the input signal CLK through inverter 16. The fingers 12a and 12b are shielded by shielding wires 14a and 14b on the outer sides and by shielding wire 14c between the fingers 12a and 12b. By splitting the signaling wire into multiple fingers 12a and 12b, the adverse affects associated with the inductance of the signaling wire are reduced, but the increased resistive nature (of the wires 12a and 12b) results in a degradation of the signal switching quality and signal propagation speed associated with the signaling wires.

Therefore, the inventors hereof have recognized the need for a system and method that reduces the adverse affects associated with inductive signaling wires on integrated circuits (such as overshoot/undershoot and ringing affects) while maintaining or improving desirable signal propagation characteristics (such as fast signal transitions and propagation speeds).

SUMMARY

A system for propagating an electrical voltage signal is disclosed. The system includes an elongated electrical conducting signal wire over which the electrical voltage signal is propagated. The system further includes a pair of electrical conducting shielding wires positioned parallel to and on opposite longitudinal sides of said signal wire, and a shielding signal applied to the pair of shielding wires. The shielding signal is configured to be out of phase with the electrical voltage signal.

DETAILED DESCRIPTION OF AN EMBODIMENT

The present invention generally involves "actively" shielding the signaling wires on an integrated circuit instead of passively shielding the signaling wires. The signaling wires are actively shielded by applying a signal voltage to the shielding wires instead of simply connecting them to ground.

Figure 1:
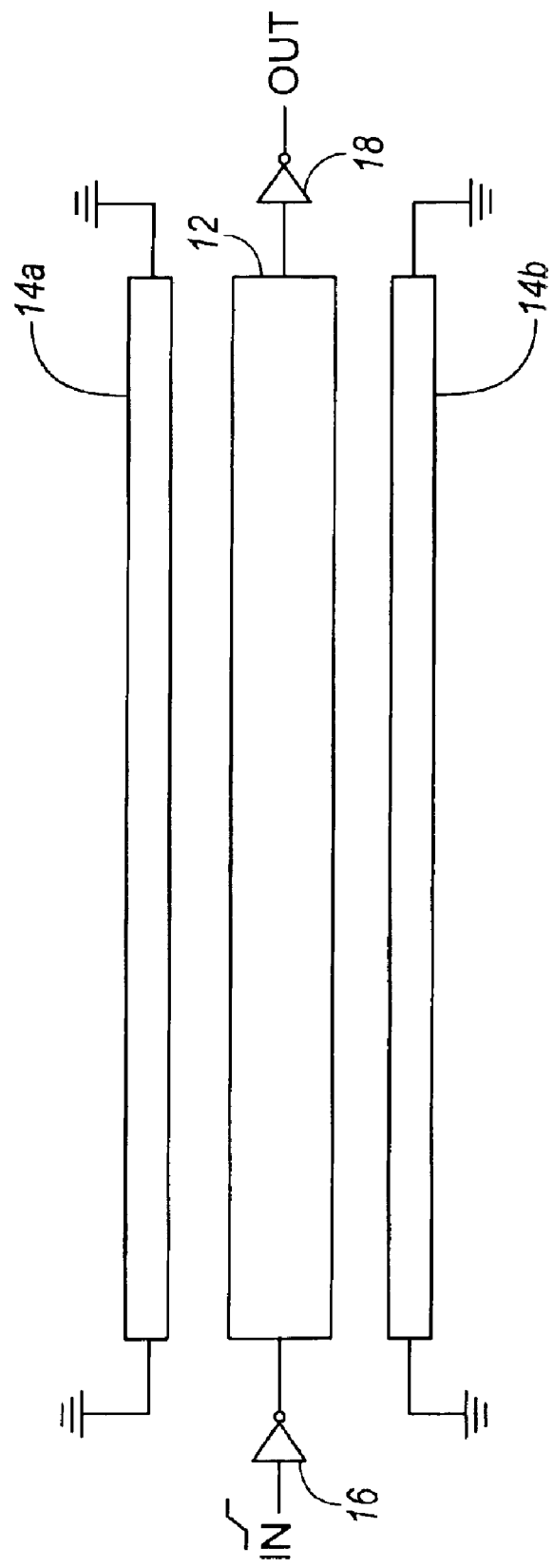
FIG. 1 is an illustration of a signal wire and a pair of passive shielding wires.
Figure 2:
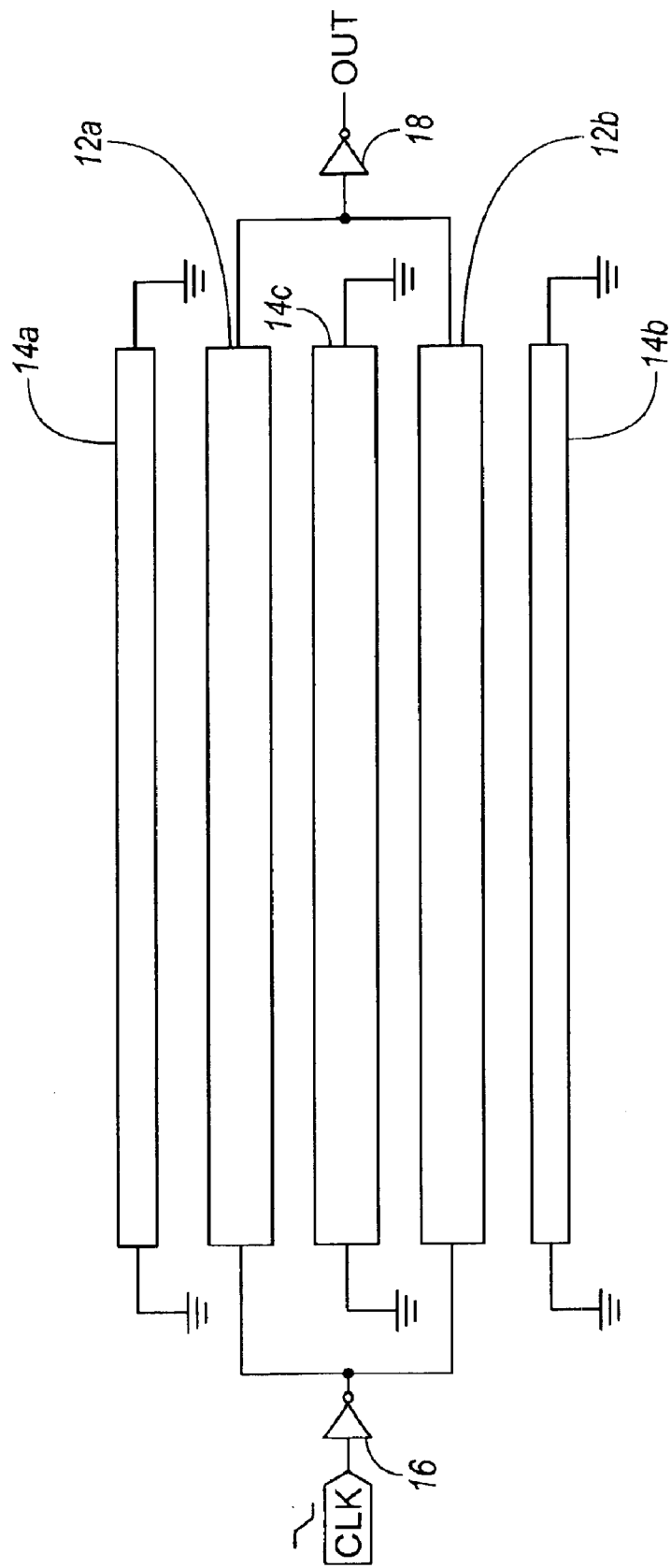
FIG. 2 is an illustration of a signal wire split into a plurality of fingers and multiple passive shielding wires.
Figure 3:
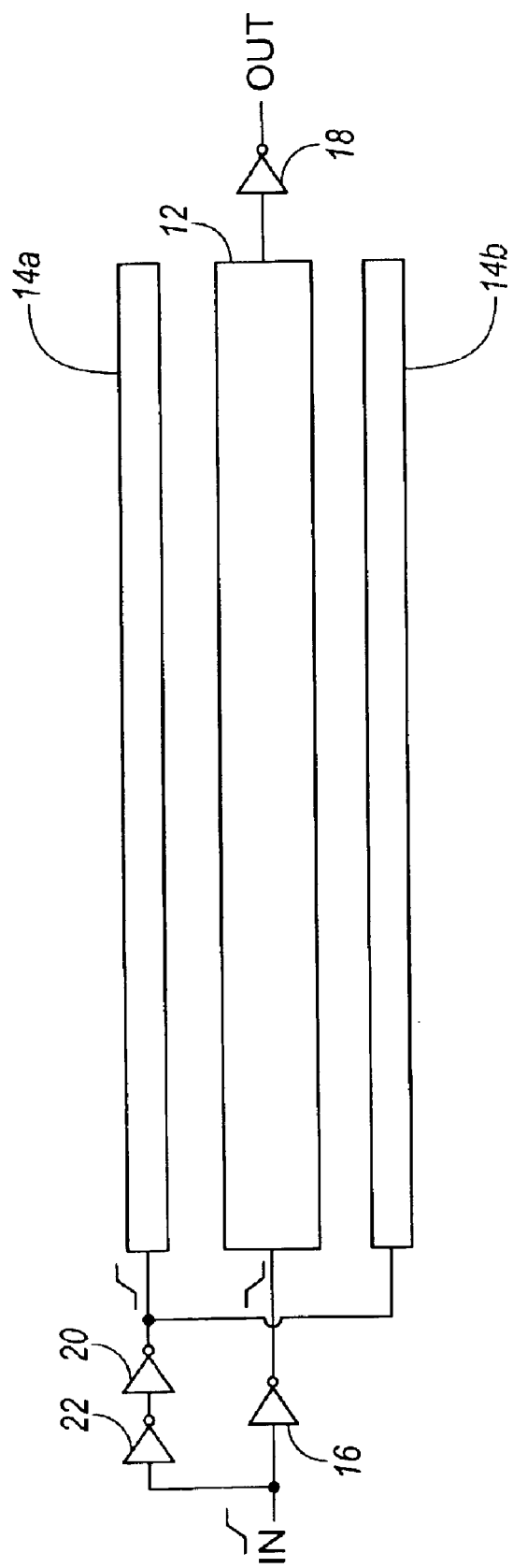
FIG. 3 is an illustration of a signal wire and a pair of active shielding wires according to an embodiment of the invention.

One possible exemplary embodiment of the invention is illustrated in FIG. 3. As illustrated, a signaling wire 12 receives an input signal through inverter 16. The input signal propagates down signaling wire 12 to inverter 18, which reverses the polarity of the signal (to its original polarity)

and outputs it as a signal available for the next logic stage in the integrated circuit. Shielding wires 14a and 14b are longitudinally positioned parallel to and on opposite sides of signaling wire 12. A "shielding voltage signal" is applied to both shielding wires 14a and 14b. The application of a "shielding voltage signal" to the shielding wires is referred to herein as "active shielding." Because the shielding wires are not used for carrying a signal that is processed and used, the shielding wires do not need to be terminated in any particular way. The shielding voltage signal is forced to be 180 degrees out of phase with the input signal by inverters 20 and 22. As a result, the shielding signal propagates down the shielding wires 14a and 14b 180 degrees out of phase with the input signal propagating down signaling wire 12. In essence, each time the signal on wire 12 changes from "0" to "1", the signal on the shielding wires 14a and 14b changes from "1" to "0." For an inductive signaling wire, where inductive coupling is stronger than capacitive coupling, applying a voltage signal to the shielding wires that is 180 out of phase with the signal on the signaling wire assists the signal transition on the signal wire through inductive coupling. At the same time, the active shielding wires serve as better current return paths than passive shielding wires, and, hence, help to reduce the ringing affect on the signaling wire.

Figure 4:
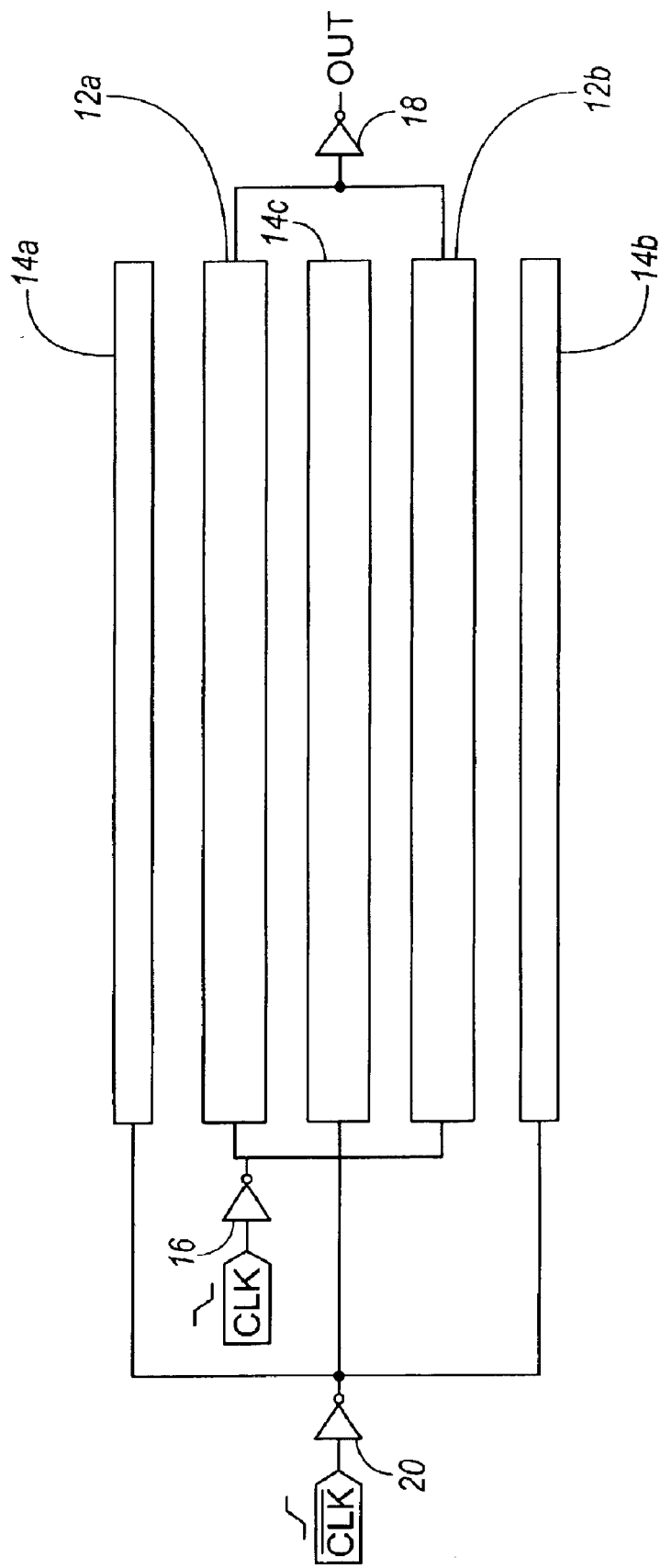
FIG. 4 is an illustration of a signal wire split into a plurality of fingers and multiple active shielding wires according to an embodiment of the invention.

FIG. 4 illustrates an embodiment of the invention applied to a clock net on an integrated circuit, wherein the signaling wire comprises two fingers 12a and 12b. When the signaling wire is split into two or more fingers, shielding wires are longitudinally positioned parallel to and on opposite sides of the signaling wires as well as between the signaling wires. In the embodiment shown in FIG. 4 having two fingers 12a and 12b, shielding wires 14a and 14b are positioned on the outer sides of the fingers 12a and 12b, and shielding wire 14c is positioned between the fingers 12a and 12b. An input signal CLK is propagated over the signaling fingers 12a and 12b through inverter 16. The CLK signal is combined at the end of signaling fingers 12a and 12b and inverted to its original polarity as an output signal available for use in the next logic stage on the integrated circuit. An inverse CLK signal (180 degrees out of phase with the CLK signal) is applied to the shielding wires 14a, 14b and 14c. As described above, the inverse CLK signal on the shielding wires increases the signal transition speed (and thus the propagation of the signal) on the signaling fingers 12a and 12b and assists in reducing the ringing affect associated with the inductance of the signaling wire. As indicated above, because the shielding wires are not used to carry a signal of interest, the shielding wires do not have to be terminated in any particular manner. As shown in FIG. 4, the ends of the shielding wires are unterminated—that is, they are not connected to any sensing or receiving circuitry.

Because the described technique of actively shielding the signaling wire reduces the ringing affect on the signaling wire, the integrity and reliability of the signal is increased relative to passively-shielded wires. Moreover, because the described technique of actively shielding the signaling wire improves the signal transitions, the propagation speed of the signal is increased relative to a passively-shielded signal wire having the same number of fingers that comprise the signaling wire.

While the invention has been described in reference to a particular embodiment thereof, the invention may be embodied in other specific forms without departing from its spirit or essential characteristics. By way of example only, while embodiments of the invention have been described wherein the voltage signal applied to the shielding wires is 180 degrees out of phase with the signal of interest, the desirable results associated with the invention may also be achieved by applying a voltage signal to the shielding wires that is out of phase with the signal of interest in a magnitude other than 180 degrees. Moreover, the present invention may be applied to signal wires that are split into any number of fingers. Accordingly, the described embodiment is to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A system for propagating an electrical voltage signal on an integrated circuit chip, comprising:
    an elongated electrical conducting signal wire located on the integrated circuit chip, over which the electrical voltage signal is propagated;
    a pair of electrical conducting shielding wires positioned parallel to and on opposite longitudinal sides of said signal wire; and
    a shielding signal applied to said pair of shielding wires, said shielding signal being out of phase with the electrical voltage signal.

2. The system of claim 1, wherein said shielding signal is approximately 180 degrees out of phase with the electrical voltage signal.

3. The system of claim 2, wherein said electrical voltage signal is a clocking signal.

4. The system of claim 2, wherein said elongated electrical conducting signal wire comprises a plurality of electrical conducting fingers that are electrically connected to each other at their respective ends;
    further comprising additional electrical conducting shielding wires positioned parallel to and between said electrical conducting fingers; and
    wherein said shielding signal is additionally applied to said additional shielding wires.

5. The system of claim 1, wherein said elongated electrical conducting signal wire comprises a plurality of electrical conducting fingers that are electrically connected to each other at their respective ends;
    further comprising additional electrical conducting shielding wires positioned parallel to and between said electrical conducting fingers; and
    wherein said shielding signal is additionally applied to said additional shielding wires.

6. The system of claim 1, wherein one end of each shielding wire is unterminated.

7. A method of improving signal propagation characteristics on an electrical conducting signal wire on an integrated circuit chip, comprising the steps:
    providing a pair of parallel electrical conducting shielding wires on opposite longitudinal sides of the signal wire; and
    applying a shielding signal to said pair of shielding wires, said shielding signal being out of phase with a signal of interest propagated on said signal wire.

8. The method of claim 7, wherein said shielding signal is approximately 180 degrees out of phase with said signal of interest propagated on said signal wire.

9. The method of claim 8, wherein said signal of interest is a clocking signal.

10. The method of claim 9, further comprising the steps:
    splitting the signal wire into a plurality of conducting fingers;

providing additional parallel shielding wires longitudinally between said conducting fingers; and applying said shielding signal to said additional shielding wires.

11. The method of claim 10, wherein said shielding signal is approximately 180 degrees out of phase with said signal of interest propagated on said signal wire.

12. The method of claim 11, wherein said signal of interest is a clocking signal.

13. An integrated circuit, comprising:

a signal wire connected between a first electrical component and a second electrical component of the integrated circuit, said signal wire being configured to facilitate the propagation of an electrical signal of interest from said first electrical component to said second electrical component;

a pair of parallel shielding wires positioned on opposite longitudinal sides of said signal wire; and a shielding signal propagated on said shielding wires, said shielding signal being out of phase with said signal of interest.

14. The integrated circuit of claim 13, wherein said shielding signal is approximately 180 degrees out of phase with said signal of interest.

15. The integrated circuit of claim 14, wherein said signal of interest is a clocking signal.

16. A system for propagating an electrical signal on an integrated circuit chip, comprising:

an electrically conductive signal wire located on the integrated circuit chip, over which the electrical signal is propagated;

a pair of electrically conductive shielding wires positioned parallel to and on opposite longitudinal sides of said electrically conductive signal wire;

wherein the width of said electrically conductive shielding wires is no more than approximately the width of said electrically conductive signal wire; and a shielding signal applied to said pair of shielding wires, said shielding signal being out of phase with the electrical signal.

17. The system of claim 16, wherein said shielding signal is approximately 180 degrees out of phase with the electrical signal.

18. The system of claim 17, wherein said electrical signal is a clocking signal.

19. The system of claim 16, wherein said electrically conductive signal wire comprises a plurality of electrical conducting fingers that are electrically connected to each other at their respective ends;

further comprising additional electrically conductive shielding wires positioned parallel to and between said electrical conducting fingers; and wherein said shielding signal is additionally applied to said additional shielding wires.

20. The system of claim 17, wherein said electrically conductive signal wire comprises a plurality of electrical conducting fingers that are electrically connected to each other at their respective ends;

further comprising additional electrically conductive shielding wires positioned parallel to and between said electrical conducting fingers; and wherein said shielding signal is additionally applied to said additional shielding wires.

21. The system of claim 16, wherein one end of each shielding wire is unterminated.

22. A method of improving signal propagation characteristics on an electrically conductive signal wire on an integrated circuit chip, comprising the steps:

providing a pair of parallel electrically conductive shielding wires on opposite longitudinal sides of the signal wire, said electrically conductive shielding wires being no wider than approximately the width of said electrically conductive signal wire; and applying a shielding signal to said pair of shielding wires, said shielding signal being our of phase with a signal of interest propagated on said signal wire.

23. The method of claim 22, wherein said shielding signal is approximately 180 degrees out of phase with said signal of interest propagated on said signal wire.

24. The method of claim 23, wherein said signal of interest is a clocking signal.

25. The method of claim 24, further comprising the steps:

splitting the signal wire into a plurality of conducting fingers;

providing additional parallel shielding wires longitudinally between said conducting fingers; and applying said shielding signal to said additional shielding wires.

26. The method of claim 25, wherein said shielding signal is approximately 180 degrees out of phase with said signal of interest propagated on said signal wire.

27. The method of claim 26, wherein said signal of interest is a clocking signal.

28. An integrated circuit, comprising:

a signal wire connected between a first electrical component and a second electrical component of the integrated circuit, said signal wire being configured to facilitate the propagation of an electrical signal of interest from said first electrical component to said second electrical component;

a pair of parallel shielding wires positioned on opposite longitudinal sides of said signal wire;

wherein the width of said shielding wires is no more than approximately the width of said signal wire; and a shielding signal propagated on said shielding wires, said shielding signal being out of phase with said signal of interest.

29. The integrated circuit of claim 28, wherein said shielding signal is approximately 180 degrees out of phase with said signal of interest.

30. The integrated circuit of claim 29, wherein said signal of interest is a clocking signal.

* * * * *

UNITED STATES PATENT AND TRADEMARK OFFICE
CERTIFICATE OF CORRECTION

PATENT NO. : 6,919,619 B2 Page 1 of 1
DATED : July 19, 2005
INVENTOR(S) : Dennis M. Sylvester et al.

It is certified that error appears in the above-identified patent and that said Letters Patent is hereby corrected as shown below:

Column 6,
Line 17, replace "our" with -- out --.

Signed and Sealed this

Eleventh Day of October, 2005

JON W. DUDAS
*Director of the United States Patent and Trademark Office*